(12) United States Patent
Schlenga et al.

(10) Patent No.: US 6,777,938 B2
(45) Date of Patent: Aug. 17, 2004

(54) NMR MAGNET COIL SYSTEM WITH SEPARATE SUPERCONDUCTING SHORT-CIRCUITED REGIONS FOR DRIFT COMPENSATION AS WELL AS METHOD FOR OPERATION THEREOF

(75) Inventors: Klaus Schlenga, Eggenstein-L. (DE); Wolfgang Frantz, Karlsruhe (DE); Gerhard Roth, Rheinstetten (DE); Pierre-Alain Bovier, Zurich (CH); Andreas Amann, Zurich (CH); Robert Schauwecker, Zurich (CH)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 10/282,040

(22) Filed: Oct. 29, 2002

(65) Prior Publication Data

US 2003/0094951 A1 May 22, 2003

(30) Foreign Application Priority Data

Nov. 15, 2001 (DE) ......................... 101 55 997

(51) Int. Cl.⁷ .............................................. G01V 3/00
(52) U.S. Cl. ....................................................... 324/322
(58) Field of Search ................................ 324/318, 322

(56) References Cited

U.S. PATENT DOCUMENTS

| | | | | |
|---|---|---|---|---|
| 4,535,291 A | * | 8/1985 | Lee et al. ..................... | 324/320 |
| 4,926,289 A | * | 5/1990 | Reichert ....................... | 361/141 |
| 5,426,366 A | * | 6/1995 | Overweg et al. ............. | 324/319 |
| 5,627,709 A | * | 5/1997 | Salasoo ........................ | 361/19 |
| 5,644,233 A | * | 7/1997 | Bird et al. .................... | 324/318 |
| 5,739,997 A | * | 4/1998 | Gross ........................... | 361/19 |
| 6,014,069 A | * | 1/2000 | Havens et al. ............... | 335/216 |
| 6,265,960 B1 | * | 7/2001 | Schauwecker et al. ...... | 335/301 |
| 6,307,370 B1 | * | 10/2001 | Schauwecker et al. ...... | 324/318 |
| 6,369,464 B1 | | 4/2002 | Schauwecker | |
| 2002/0171520 A1 | | 11/2002 | Yoshikawa | |

FOREIGN PATENT DOCUMENTS

| | | |
|---|---|---|
| EP | 1 065 512 | 1/2001 |
| JP | 11 087 129 | 3/1999 |
| JP | 2000068118 | 3/2000 |
| WO | WO 00 52 490 | 9/2000 |

* cited by examiner

Primary Examiner—Diego Gutierrez
Assistant Examiner—Dixomara Vargas
(74) Attorney, Agent, or Firm—Paul Vincent

(57) ABSTRACT

An NMR magnet coil system, comprising superconducting conductor structures, with an inductance $L_0$ for generating a homogeneous magnetic field $B_0$ through which an operating current $I_0$ flows in the persistent mode, and wherein further superconducting switches (S1, S2, ... Sn−1) are each provided between two points (P1, Q1), (P2, Q2), ..., (Pn−1, Qn−1) of the winding of the magnet coil system, during operation, separately superconductingly short-circuit one or more disjoint partial regions (1, 2, ..., n−1) with the inductances $L_1, L_2, \ldots, L_{n-1}$ to generate magnetic field contributions $B_1, B_2, \ldots, B_{n-1}$ to the homogeneous magnetic field $B_0$, is characterized in that the following is valid:

$$\alpha = \left| L_0 \sum_{j=1}^{n} (L^{-1})_{jn} \frac{B_j}{B_0} \right| \leq 0.8$$

wherein $B_n$ is the magnetic field contribution to the homogeneous magnetic field $B_0$ of the residual region (n) of the magnet coil system, reduced by the separately superconductingly short-circuited partial regions (1, 2, ..., n−1) and having the inductance $L_n$, wherein $(L^{-1})_{jn}$ is the entry of the jth line and nth column of the inverse of the entire inductance matrix of the magnet coil system and wherein $L_0$ is the total magnetic inductance (sum of all entries of the inductance matrix). This permits substantial compensation of magnetic field drift caused by a residual resistance in a winding of the superconducting conductor structures of the coil system with little technical effort and without using a separate drift compensation coil, even in existing coil systems.

19 Claims, 7 Drawing Sheets

NMR MAGNET COIL SYSTEM WITH SEPARATE SUPERCONDUCTING SHORT-CIRCUITED REGIONS FOR DRIFT COMPENSATION AS WELL AS METHOD FOR OPERATION THEREOF

This application claims Paris Contention priority of DE 101 55 997.6 filed Nov. 15, 2001 the complete disclosure of which is hereby incorporated by reference.

BACKGROUND OF THE INVENTION

The invention concerns an NMR (nuclear magnetic resonance) magnet coil system, comprising superconducting conductor structures, with an inductance $L_0$ for generating a homogeneous magnetic field $B_0$ in a measuring volume, wherein the magnet coil system is short-circuited by at least one superconducting switch through which an operating current $I_0$ flows in the persistent mode, and wherein one or more further superconducting switches are provided, each between two points of the winding of the magnet coil system which, during operation, separately superconductingly short-circuit one or more disjoint partial regions of the magnet coil system with the inductances $L_1, L_2, \ldots, L_{n-1}$ which generate magnetic field contributions $B_1, B_2, \ldots, B_{n-1}$ to the homogeneous magnetic field $B_0$ in the measuring volume.

An arrangement of this type is known e.g. from DE 199 32 412 C1.

Superconducting magnets are used in various fields of application including, in particular, magnetic resonance methods, wherein one distinguishes between imaging methods (magnetic resonance imaging=MRI) and spectroscopic methods. To obtain good spatial or spectral resolution with such methods, the magnetic field in the measuring volume must have high homogeneity of generally less than 1 ppm.

These investigations require increasingly higher magnetic field strengths. Many magnetic resonance apparatus are therefore equipped with superconducting magnet coil systems which can operate in the superconductingly short-circuited persistent mode for very long time periods without necessitating recharging which would interrupt the measuring process (and often cause considerable disturbances due to possibly required re-adjustments).

However, even superconductors below the transition temperature are not, in reality, completely free from residual electrical resistance. Such resistances can vary by orders of magnitude and are due to unpredictable, generally not retraceable, and often manufacture-related variations in the several windings of an NMR magnet coil system.

These residual resistances in the windings of the magnet coil system cause a drift in the operational current $I_0$ which changes the strength of the homogeneous magnetic field $B_0$ and thereby causes a shift in the resonance frequency set in the NMR arrangement. Such drifts can typically be of the order of magnitude of 100 Hz/h for magnet coil systems with a resonance frequency of more than 300 MHz.

One approach to solve or at least reduce the drift problem in NMR spectrometers is to provide a separate drift compensation coil. NMR spectrometers of this type have a so-called $z_0$ coil as part of a superconducting shim means which, in addition to its actual shim function, can also be used for compensation of the above-described magnetic field drifts and for exact adjustment of the resonance frequency of the NMR arrangement. Since $z_0$ coils of this type can only compensate for very small drifts, the above-described drift problem cannot be solved or can only be solved to an insufficient degree in superconducting magnet systems having a coil winding with a somewhat larger residual resistance.

The above-cited DE 199 32 412 C1 describes an NMR magnet coil system comprising a means for compensating external magnetic field disturbances. Since the magnetic field drift is caused by a residual resistance in the superconducting coil windings of the magnet system itself, this known arrangement cannot compensate for such a drift.

In contrast thereto, it is the underlying purpose of the invention to further develop an NMR magnet coil system having the above-mentioned features such that a magnetic field drift produced by a residual resistance in a winding of the superconducting conductor structures of the coil system is compensated for, at least to a considerable extent, with little technical effort, without separate drift compensation coil and, if possible, also for existing coil systems.

SUMMARY OF THE INVENTION

This object is achieved in accordance with the invention in a surprisingly simple and effective fashion through:

$$\alpha = \left| L_0 \sum_{j=1}^{n} (L^{-1})_{jn} \frac{B_j}{B_0} \right| \leq 0.8$$

with $1 \leq j \leq n$
wherein $B_n$ is the magnetic field contribution to the homogeneous magnetic field $B_0$ of the residual region of the magnet coil system, reduced by the separately superconductingly short-circuited partial regions, and having the inductance $L_n$, with $(L^{-1})_{jn}$ being the entry of the jth line and nth column of the inverse of the overall inductance matrix of the magnet coil system, wherein $L_0$ is the total magnetic inductance (sum of all contributions to the inductance matrix).

Highly effective compensation of magnetic field drifts due to erratically occurring residual resistances in regions of the superconducting conductor structures of an NMR magnet coil system of this type is thereby possible with means which are technically easy to implement and without using an additional drift compensation coil. The invention can also be realized in existing superconducting NMR magnet coil systems, since no additional space is required.

The "trick" of the invention is essentially that, through separate superconducting short-circuiting of suitable partial regions of the magnet coil system with respect to the superconductingly short-circuited residual region, the current drift and therefore also the magnetic field drift can be substantially compensated for. To obtain usable results, the above-described condition for the value $\alpha$ must be maintained, since $\alpha$ corresponds to the ratio between the magnetic field drift with short-circuited partial regions and the magnetic field drift without short-circuited partial regions.

The invention can be realized in a relatively simple fashion through installation of one or more additional superconducting switches or through already existing superconducting switches in the apparatus. During charging of the NMR magnet system, the additional switches are also heated. As soon as the system passes over into the operational mode, the switches are short-circuited to effect compensation of the drift.

One embodiment of the inventive magnet arrangement is particularly preferred, wherein exactly one further superconducting switch is provided between two points P1 and Q1 of the winding of the magnet coil system which, during operation, separately superconductingly short-circuits a partial region of the magnet coil system with the inductance $L_1$ which generates in the measuring volume a magnetic field contribution $B_1$ to the homogeneous magnetic field $B_0$, wherein:

$$\alpha = \left| \frac{L_0}{L_1 L_2 - L_{12}^2} \left( \frac{B_2}{B_0} L_1 - \frac{B_1}{B_0} L_{12} \right) \right| \leq 0.8$$

wherein $B_2$ is the magnetic field contribution to the homogeneous magnetic field $B_0$ of the residual region of the magnet coil system, which is reduced by the separately superconductingly short-circuited partial region and having the inductance $L_2$ and mutual inductance $L_{12}$ relative to the separate superconducting short-circuited partial region.

This simple arrangement provides merely one additional switch for short-circuiting a partial region with respect to the residual region of the magnet coil system. NMR high field magnet systems are generally built from coaxially nested winding sections. If there is an increased residual resistance in one of these sections, separate superconducting short-circuiting of one or more suitable sections (in addition to the superconducting short-circuit of the entire arrangement during persistent mode) can compensate for the magnetic field drift in a simple and effective fashion such that demanding and usually very expensive exchange of the defective coil section with another (which could also prove to be defective) is eliminated.

As mentioned above, the value of $\alpha$ should be less or equal to 0.8 to obtain a considerable compensation effect. The parameters should preferably be set such that $\alpha \leq 0.5$, preferably $\alpha \leq 0.2$, particularly preferred $\alpha \leq 0.05$. This corresponds to a reduction of the magnetic field drift to 50%, or 20%, or 5% of the value without superconductingly short-circuited partial regions.

One embodiment of the invention is particularly preferred wherein the separately superconductingly short-circuited partial regions and the residual region of the magnetic coil system are constructed such that the residual region produces a largely homogeneous magnetic field contribution $B_0$ to the homogeneous magnetic field $B_0$ in the measuring volume. This maintains the homogeneity of the overall magnetic field in the measuring volume even when the magnetic field drifts cannot be completely compensated for.

In a simple further development of the above-described embodiment of the inventive magnet arrangement, the separately superconductingly short-circuited partial regions and the residual region of the magnet coil system each comprise a homogenization means for homogenizing the magnetic field contribution $B_j$ generated by the respective partial region or residual region in the measuring volume, and the homogenization means of the different regions are spatially separated. Homogenization means of this type can consist, in particular, of additional homogenization windings for the superconducting conductor structures of the NMR magnet coil system. The use of permanent magnetic shim elements for homogenizing the overall magnetic field is also feasible.

One further development of this embodiment is particularly favorable wherein the homogenization means are also spatially separated from the field-generating windings of the respectively associated partial region or the residual region of the magnet coil system. This offers considerable topological advantages mainly when the present invention is retrofitted to an already existing NMR magnet coil system.

One further development of the above-described embodiments of the invention is particularly preferred, wherein the gradient of second order largely disappears in the magnetic field contribution $B_j$ of the respective region in the measuring volume.

A further particularly preferred embodiment of the inventive magnet arrangement is characterized in that shim coils are provided and all partial regions and the residual region of the magnetic coil system, which produce magnetic field contributions $B_j$ to the homogeneous magnetic field $B_0$ in the measuring volume, are decoupled from the shim coils, in particular from $z^2$ shim coils. A possible coil drift does therefore not change the shim values.

In other embodiments of the inventive magnet arrangement, at least one additional current path may be alternatively provided which is superconductingly short-circuited during operation and is inductively coupled to the partial regions or the residual region of the magnet coil system. This additional current path can also be designed as a shim to maintain the homogeneity of the overall arrangement. Such homogenization windings are, however, not connected in series with the partial regions of the magnet coil system.

This inventive embodiment can be improved in a further development in that the additional current path(s) is/are designed such that, due to inductive charging during operation, it/they generate/s a shim field in the measuring volume which permanently compensates for inhomogeneities in the magnetic field generated by the partial regions and the residual region of the magnet coil system in the measuring volume which occur during operation.

In one particularly advantageous embodiment of the inventive magnet arrangement, the magnet coil system is formed in sections and at least one of the separately superconductingly short-circuited partial regions coincides with one or more of the sections. A coil system with such a sectioned structure is particularly easy to handle. The partial regions can be separately superconductingly short-circuited via existing joints in correspondence with the inventive teaching.

In a further development of this embodiment, in addition to the external electrical connecting lines of the individual sections, further electrical connecting lines are provided having tap points at selected locations within the sections of the magnetic coil system to achieve even finer tuned compensation effects.

In a further improvement, the tap points for the further electric connecting lines are disposed quasi continuously in winding layers on the sections of the magnet coil system to obtain optimum, fine drift compensation.

A further advantageous embodiment of the inventive magnet arrangement is characterized in that, in addition to the magnet coil system, ferromagnetic elements are provided which generate an additional magnetic field contribution $\Delta B_0$ to the magnetic field $B_0$ in the measuring volume, with the overall magnetic field $B=B_0+\Delta B_0$ in the measuring volume being homogeneous. This produces additional shim possibilities which are technically easy to realize. Moreover, the ferromagnetic elements contribute to a magnetic field increase in the measuring volume.

In another advantageous embodiment of the inventive magnet arrangement, at least one of the further superconducting switches is connected in series with a superconducting current limiter. Should the main switch open during operation, the superconductingly short-circuited partial region cannot be inductively charged up until a quench occurs. An arrangement of this type with superconducting short-circuit and current limiter in a partial region of the magnet coil system, and in fact in the main coil of an actively shielded magnet system, is known per se from U.S. Pat. No. 4,926,289. In the known arrangement, the superconducting short-circuit compensates for disturbances and for this reason, the arrangement does not satisfy the inventive condition for drift compensation.

A method for operating an NMR (nuclear magnetic resonance) magnet coil system comprising superconducting conductor structures, in particular of the above-described type, with inductance $L_0$ for generating a homogeneous magnetic field $B_0$ in a measuring volume is also within the scope of the present invention, wherein the magnet coil system is short-circuited by at least one superconducting switch through which an operating current $I_0$ flows during persistent mode and wherein one or more further superconducting switches are each provided between two points of the winding of the magnet coil system which, during operation, separately superconductingly short-circuit one or more separate partial regions of the magnet coil system having inductances $L_1$, $L_2$, ..., $L_{n-1}$ and generating magnetic field contributions $B_1$, $B_2$, ..., $B_{n-1}$ to the homogeneous magnetic field $B_0$ in the measuring volume.

The method is characterized in accordance with the invention in that the partial regions are separately superconductingly short-circuited at the beginning of persistent mode of the magnet coil system and:

$$\alpha = \left| L_0 \sum_{j=1}^{n} (L^{-1})_{jn} \frac{B_j}{B_0} \right| \leq 0.8$$

with $1 \leq j \leq n$
wherein $B_n$ is the magnetic field contribution to the homogeneous magnetic field $B_0$ of the residual region (n) of the magnet coil system, reduced by the separately superconductingly short-circuited partial regions (1, 2, ..., n−1), and having an inductance $L_n$, wherein $(L^{-1})_{jn}$ is the entry in the jth line and nth column of the inverse of the total inductance matrix of the magnet coil system, and $L_0$ is the total magnetic inductance (sum of all entries in the inductance matrix). The above object of the invention is thereby completely achieved.

In a particularly preferred variant of the inventive method, the operating current $I_0$ is recharged at defined intervals with the superconducting switch S0 being open and the further superconducting switches (S1, S2, ..., Sn−1) closed. The energy dissipated by the residual resistance in a partial region of the magnet coil system over time, is thereby replenished. The current deviations accumulating over time in the partial currents through the separately short-circuited partial regions can be reset.

One further variant of the inventive method is also advantageous wherein at least one of the further superconducting switches of the separately superconductingly short-circuited partial regions is already closed during charging of the superconducting magnet coil system when a charging current $I_x$ is reached which is smaller than the nominal value of the operating current $I_0$. This effects an advantageous negative current difference for the compensating partial region. The time at which recharging is required due to the build-up of excess current can thereby be considerably postponed.

Further advantages can be extracted from the drawings and the description. The features mentioned above and below can be used in accordance with the invention individually and collectively in any arbitrary combination. The embodiments shown and described are not to be understood as exhaustive enumeration but rather have exemplary character for describing the invention.

The invention is shown in the drawing and is explained in more detail with reference to the embodiments.

BRIEF DESCRIPTION OF THE DRAWING

FIG. 2b shows the equivalent circuit diagram of the configuration according to FIG. 2a;

FIG. 3b shows the equivalent circuit diagram of FIG. 3a; and

DESCRIPTION OF THE PREFERRED EMBODIMENT

Drift without additional switch

A short-circuited coil with inductance $L_0$ and residual resistance R is discharged due to the resistance R losses. The sum of the voltages in the closed circuit is zero. The temporal development of the magnetic current $I_0$ is given by the differential equation $$RI_0 + L_0 \frac{dI_0}{dt} = 0$$

The magnetic field drift is defined as the temporal reduction of the magnetic field in the measuring volume.

When $h_0$ is the magnetic field per ampere in the measuring volume, the drift $m_0$ is given by $$m_0 = h_0 \frac{dI_0}{dt} = -\frac{R}{L_0} h_0 I_0 = -\frac{R}{L_0} B_0$$

wherein $B_0$ is the magnetic field in the measuring volume.

Drift with an additional switch

Figure 3A:
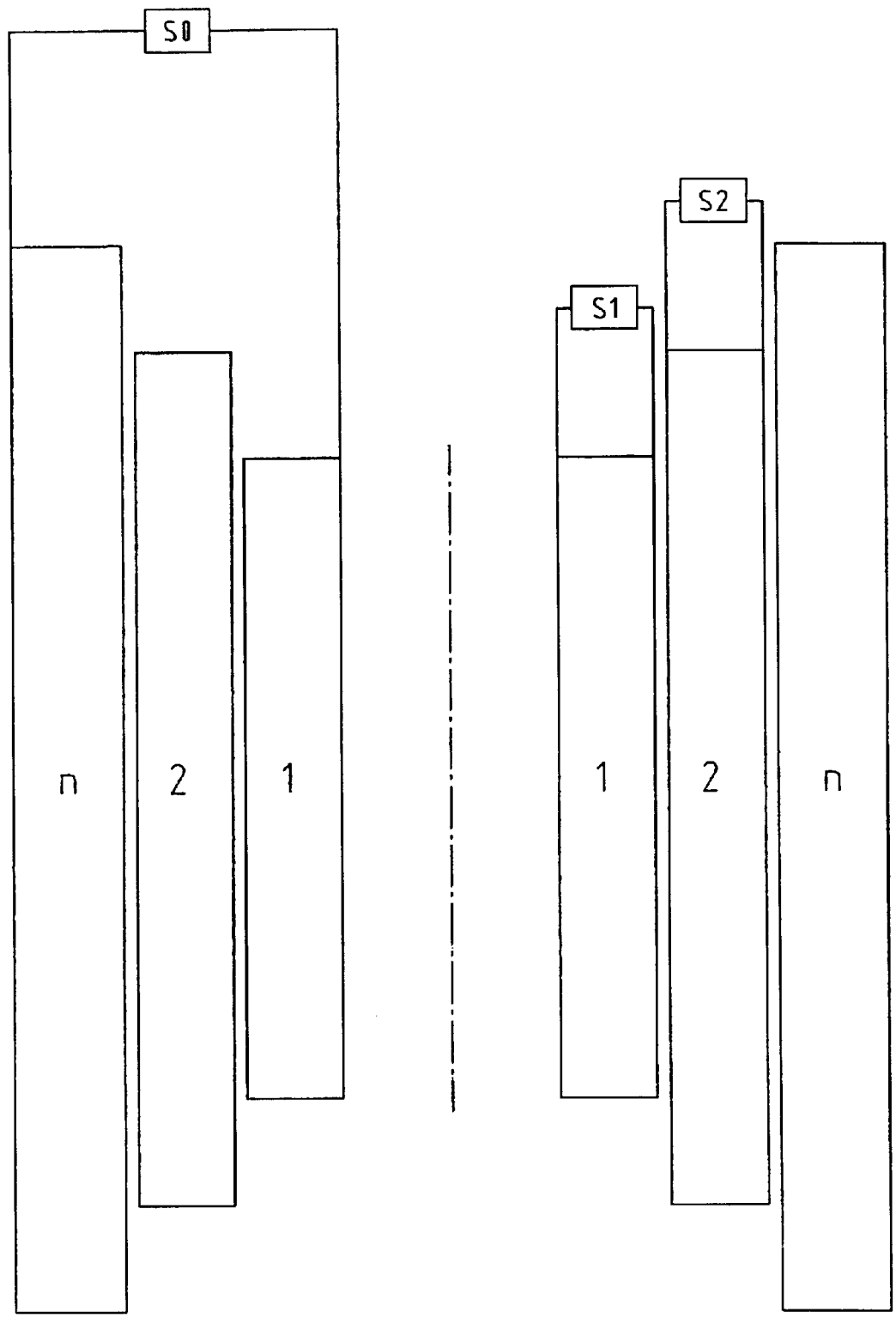
FIG. 3a shows an embodiment with two separately short-circuited magnet coil sections.

The most general case with additional switches is shown schematically in FIG. 3a.

This section only treats the case n=2. Since both coil sections are superconductingly short-circuited, it is irrelevant whether or not the additional switch bridges the section 1 or 2. The following section deals with the generalization to an arbitrary number of additional switches.

As in the above section, the time development of the currents is given by the following differential equation $$RI + L\frac{dI}{dt} = 0$$

wherein R is the diagonal matrix with the resistances of the two sections. I is the current vector and L the inductance matrix. The temporal change of the current of the different sections is thus given by $$\frac{dI}{dt} = -L^{-1}RI$$

It is assumed that the total resistance of the magnet is in the second section. The above equation, written with components, is then:

$$\frac{dI_1}{dt} = \frac{R_2 L_{12}}{L_1 L_2 - L_{12}^2} I_2$$

$$\frac{dI_2}{dt} = -\frac{R_2 L_1}{L_1 L_2 - L_{12}^2} I_2$$

If the magnetic field of the jth section with full current $I_0$ is designated $B_j$ the magnet drift with additional switches is $$m = \frac{B_1}{I_1} \frac{dI_1}{dt} + \frac{B_2}{I_2} \frac{dI_2}{dt} = \frac{R_2 L_{12}}{L_1 L_2 - L_{12}^2} B_1 \frac{I_2}{I_1} - \frac{R_2 L_1}{L_1 L_2 - L_{12}^2} B_2$$

$I_2/I_1 \approx 1$ is valid for the time periods observed and typical parameters.

The ratio between drift with additional switch and drift without additional switch is calculated as $$\alpha = \left|\frac{m}{m_0}\right| = \left|\frac{L_0}{L_1 L_2 - L_{12}^2}\left(\frac{B_2}{B_0}L_1 - \frac{B_1}{B_0}L_{12}\right)\right|$$

if the entire resistance is in the second section, wherein $L_0$ designates the entire magnetic inductance.

The dimensionless number $\alpha$ is the so-called drift factor. The number gives the factor by which the drift changes after closing the additional switch.

Drift with an arbitrary number of additional switches

In this section, the drift calculation is extended to the case of an arbitrary number of additional switches. Like in the previous section, the time development is given by the following differential equation $$RI + L\frac{dI}{dt} = 0$$

(R=diagonal matrix, L=inductance matrix, I=current vector).

The temporal changes of the currents in the different sections are given by $$\frac{dI}{dt} = -L^{-1}RI$$

For the parameters of typical magnet arrangements and typical time intervals it is admissible to replace all components of the current vector on the right-hand side of the equation by $I_0$. Moreover, it should be assumed that the total resistance of the magnet is located in the nth section. This reduces the equation to $$\frac{dI_j}{dt} = -(L^{-1})_{jn}R_n I_0, \quad j = 1, \ldots, n$$

If the magnetic field of the jth section with full current $I_0$ is again designated with $B_j$ the magnetic drift with additional switches is $$m = \sum_{j=1}^{n}\frac{B_j}{I_j}\frac{dI_j}{dt} \approx -R_n \sum_{j=1}^{n}(L^{-1})_{jn}B_j$$

The ratio between drift with additional switches and drift without additional switch is calculated as:

$$\alpha = \left|\frac{m}{m_0}\right| = \left|L_0 \sum_{j=1}^{n}(L^{-1})_{jn}\frac{B_j}{B_0}\right|$$

wherein $L_0$ designates the entire magnetic inductance (sum of all entries of the inductance matrix).

Figure 1A:
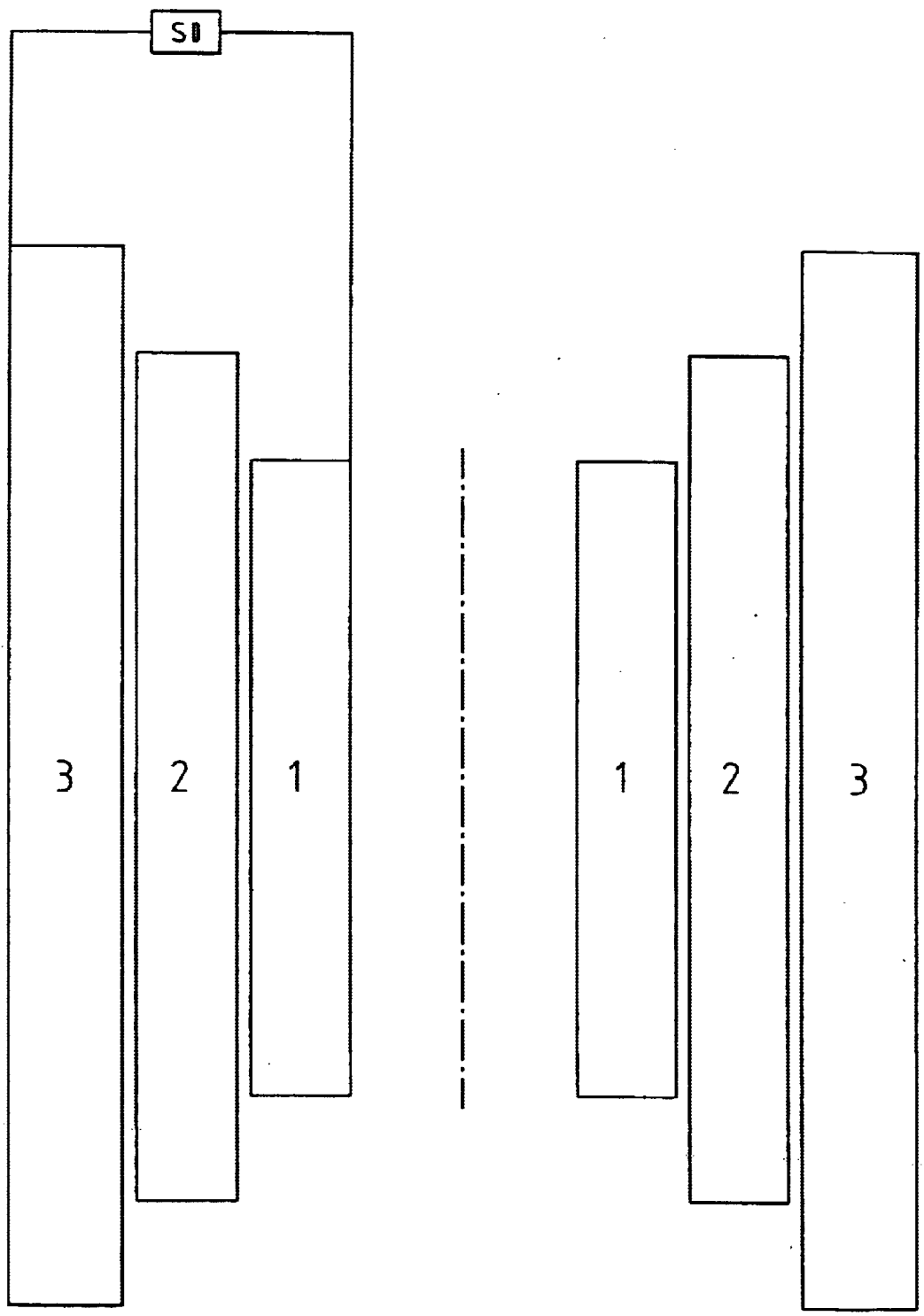
FIG. 1a shows a schematic representation of an NMR magnet coil system according to prior art.

FIG. 1a is a highly schematic vertical section through an NMR magnet coil system with three radially nested sections 1, 2, 3 which are electrically connected in series and wound like a solenoid. During operation of the superconducting magnet system, the innermost tap of the innermost coil section 1 is superconductingly short-circuited together with the outermost tap of the outermost coil section 3 via a superconducting switch S0.

Figure 1B:
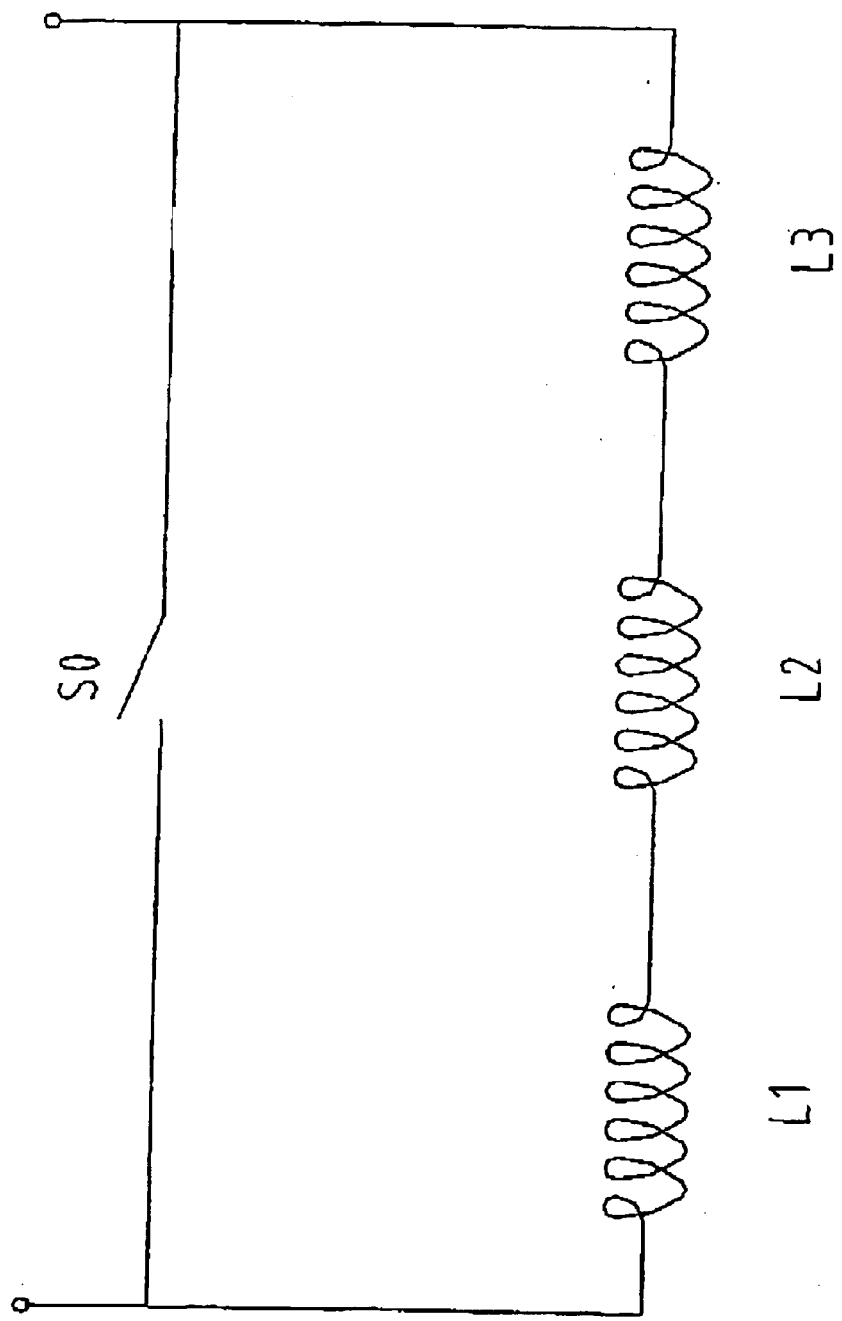
FIG. 1b shows an equivalent circuit diagram of the magnet coil system in accordance with FIG. 1a of prior art.

FIG. 1b shows an equivalent circuit diagram for the magnet coil arrangement of FIG. 1a. The three coil sections are each represented herein by an inductance L1, L2, L3.

Figure 2A:
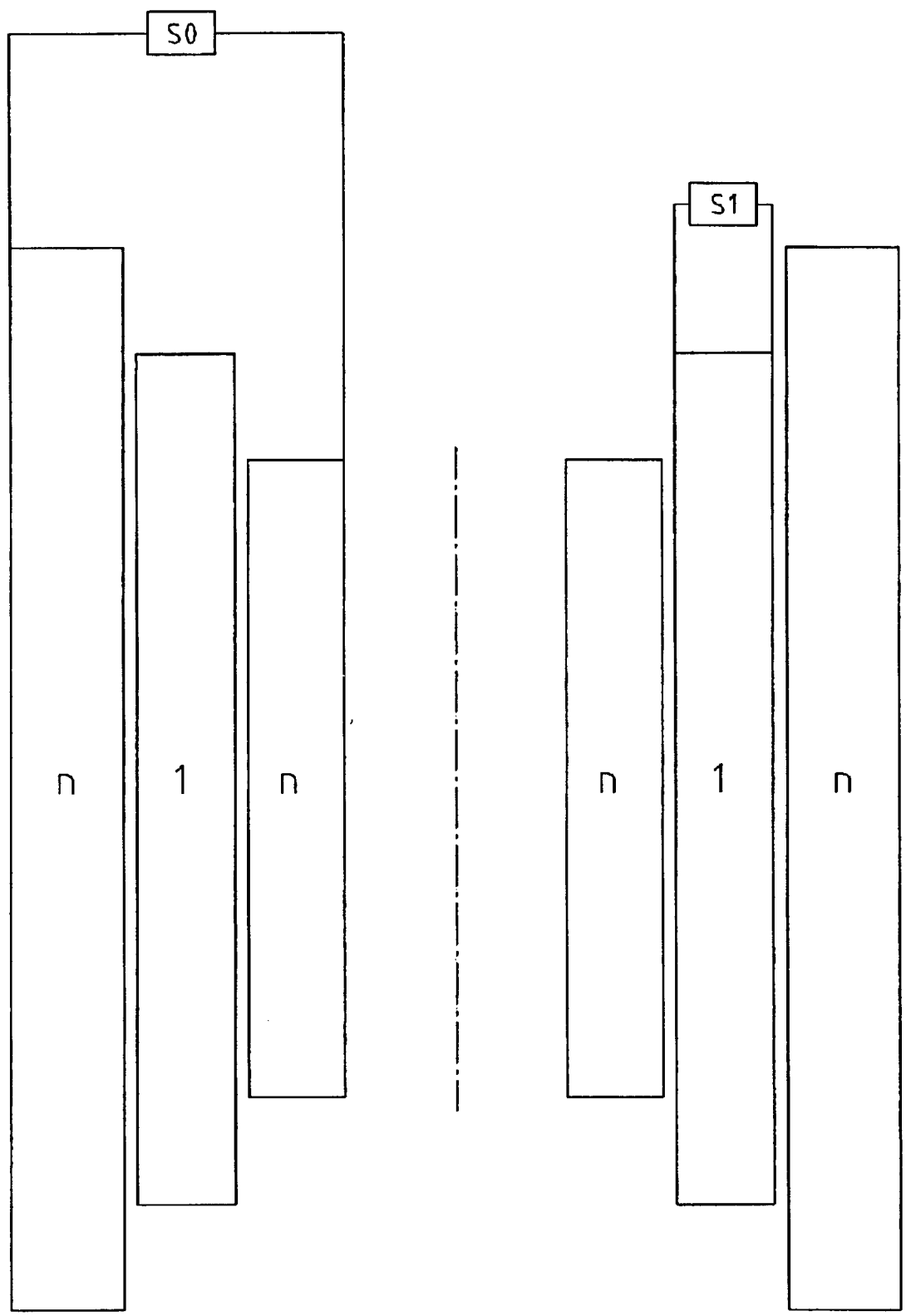
FIG. 2a shows an embodiment of the invention with short-circuited central section of the magnet coil system.

FIG. 2a shows a particularly simple embodiment of the inventive arrangement. Compared to the conventional arrangement shown in FIG. 1a, the radially central partial region 1 herein is separately superconductingly short-circuited by means of a further superconducting switch S1. The radially innermost and radially outermost coil sections together form the residual region n.

Figure 2B:
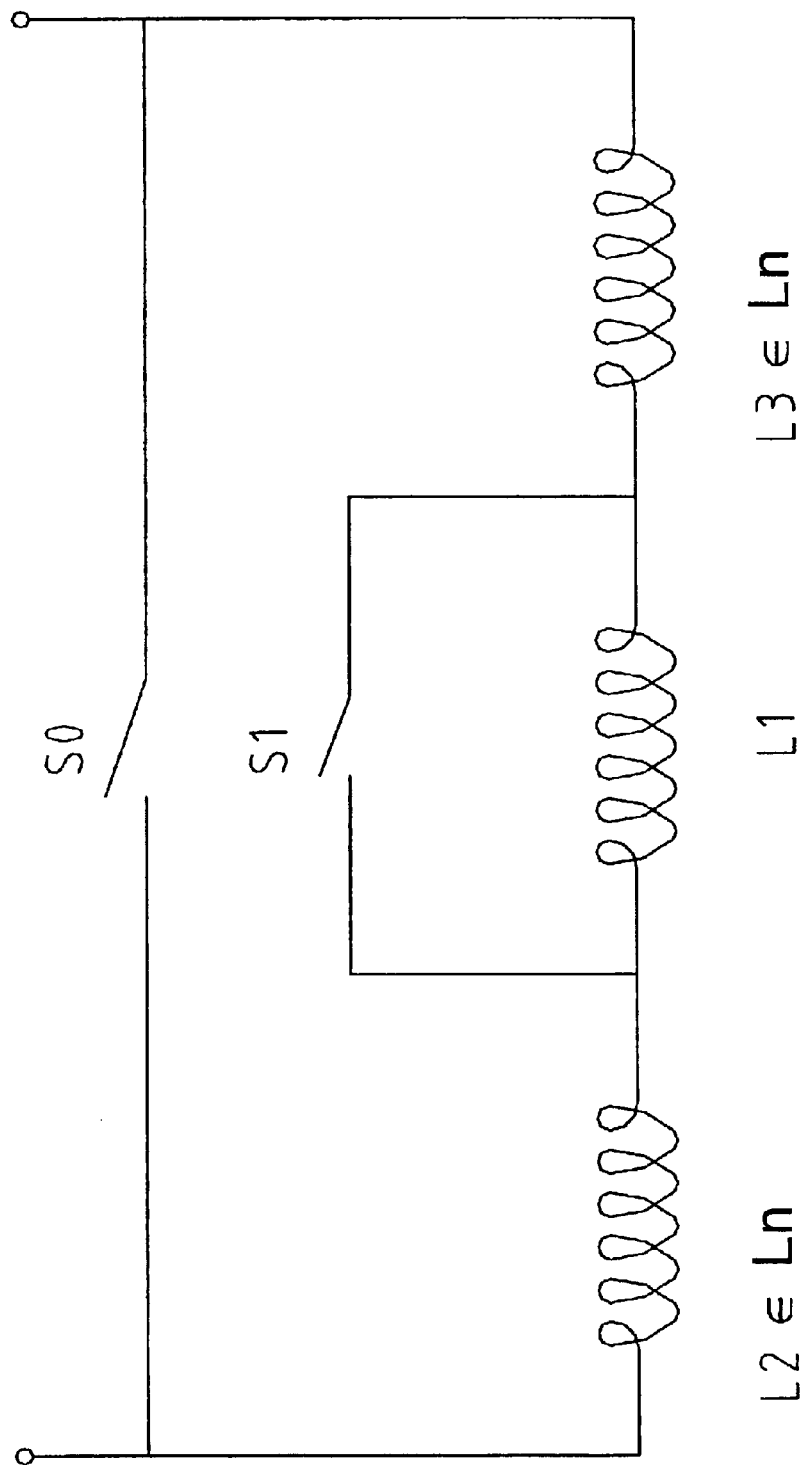

The corresponding equivalent circuit diagram for the inventive arrangement of FIG. 2a is shown in FIG. 2b with the switches being open (i.e. not in the operating state) for reasons of clarity.

FIG. 3a shows a further embodiment of the inventive arrangement wherein the radially innermost partial region is separately superconductingly short-circuited via a superconducting switch S1 and the radially central partial region is separately superconductingly short-circuited via a superconducting switch S2. The radially outermost partial region (n) is not superconductingly short-circuited per se, however, during operation of the magnet coil system, the superconducting switch S0 is also closed which connects the radially innermost and the radially outermost section of the arrangement.

Figure 3B:
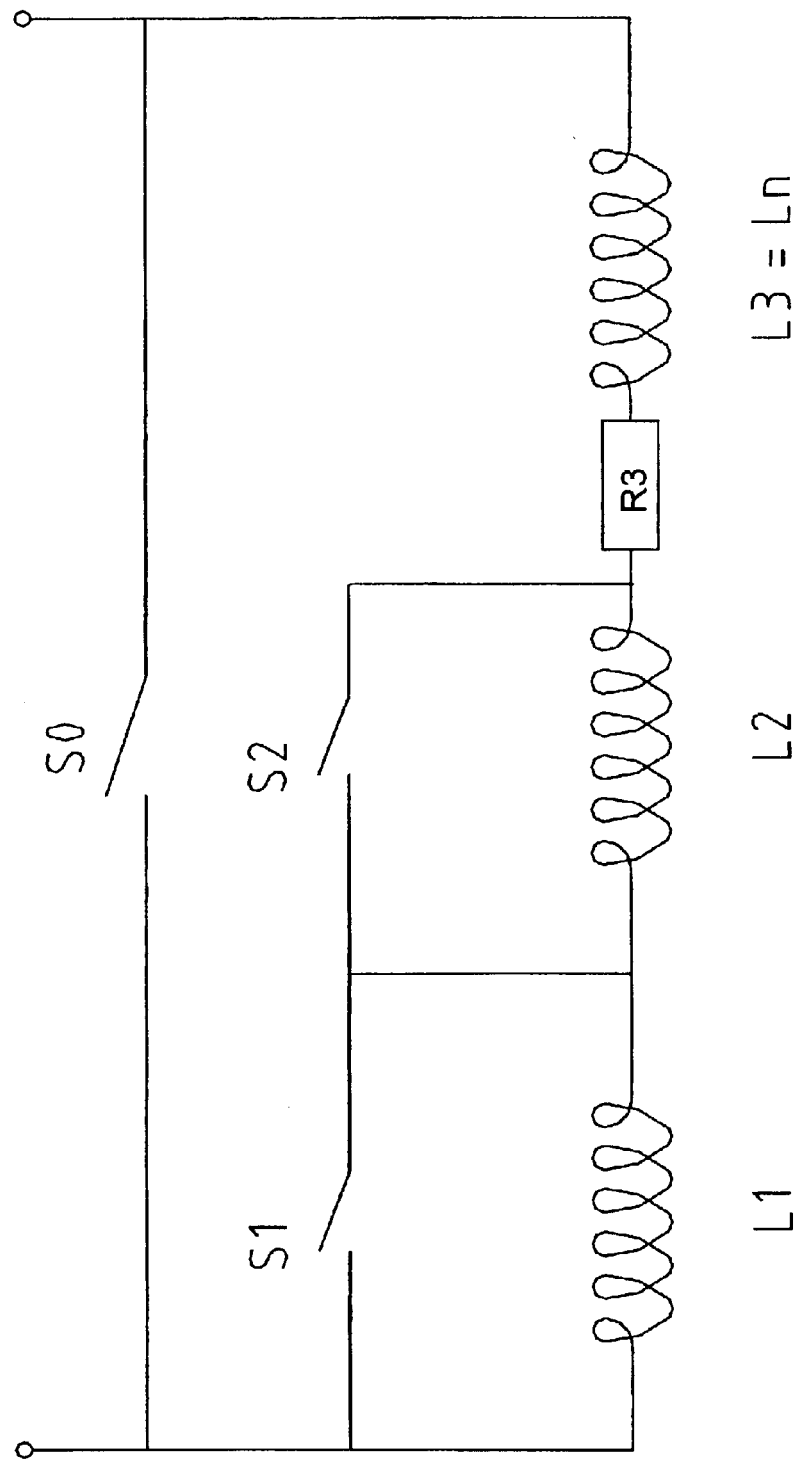

The equivalent circuit diagram which corresponds to the arrangement of FIG. 3a is shown in FIG. 3b. The superconducting switches S0, S1, S2 are also shown in the open state for reasons of clarity.

Figure 4:
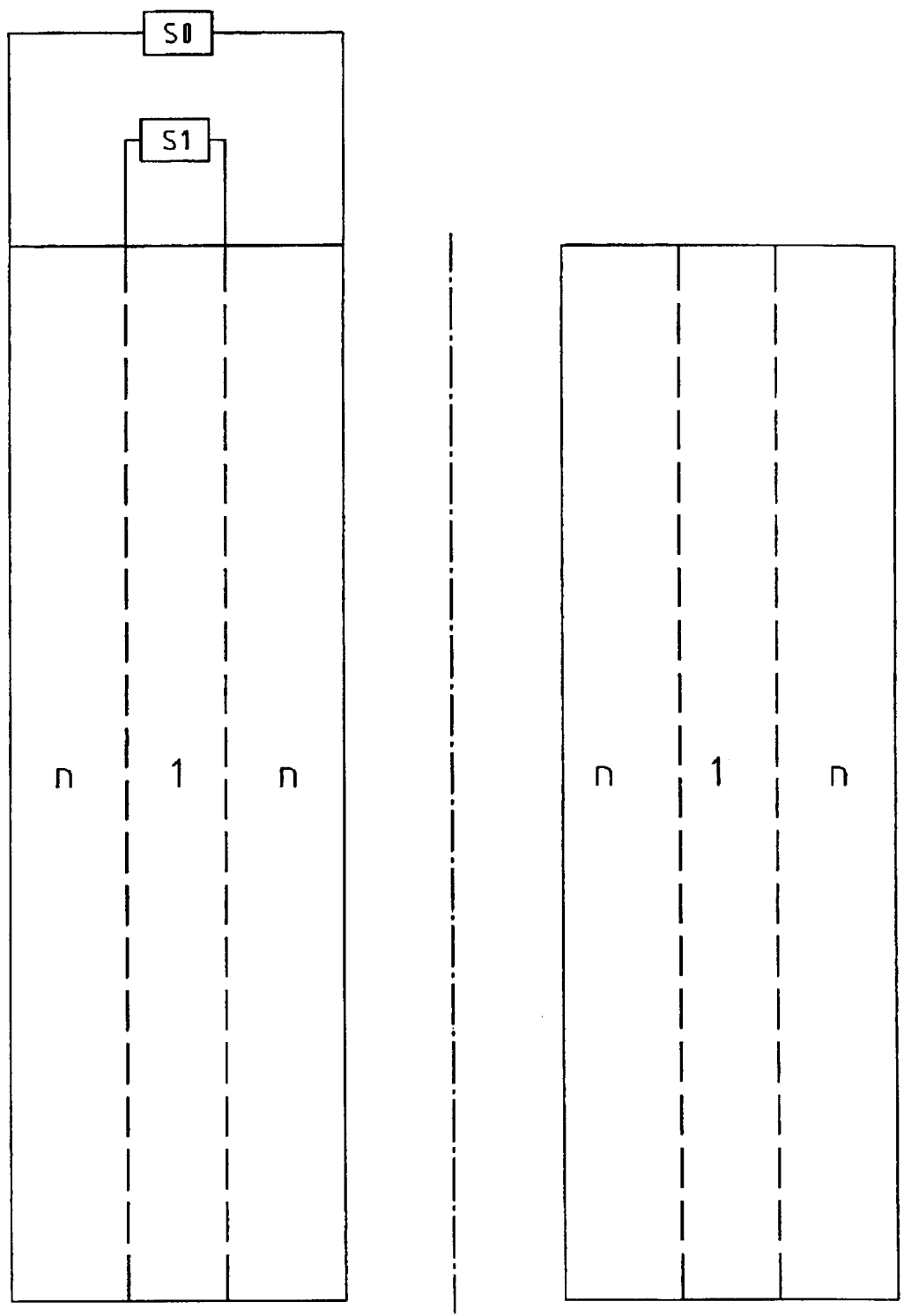
FIG. 4 shows an embodiment of the invention with continuous tapping for the partial region which can be separately short-circuited.

FIG. 4 shows an inventive embodiment with which a radially central partial region 1 is superconductingly short-circuited via a further superconducting switch S1, wherein the tap for this further superconducting switch S1 is quasi continuously disposed, wound in layers, on the coil system. The partial region of the magnet coil system which is not short-circuited by the further superconducting switch S1 represents the residual region (n). During operation, the entire magnet coil system is again superconductingly short-circuited in total via the superconducting switch S0.

An equivalent circuit diagram for the arrangement of FIG. 4 is shown in FIG. 2b, wherein the separately superconducting short-circuited partial region 1 has the inductance L1 and the residual region (n) the inductance Ln.

We claim:

1. A method for operating an NMR (nuclear magnetic resonance) magnet coil system having superconducting conductor structures with an overall magnetic inductance $L_0$ for generating a homogeneous magnetic field $B_0$ in a measuring volume, the method comprising the steps of:

a) short-circuiting the magnet coil system using at least one superconducting switch (S0) through which an operating current $I_0$ flows in a persistent mode;

b) defining one or more disjoint partial regions (1, 2, ..., n-1) of the magnet coil system which can be separately superconductingly short-circuited using one or more further superconducting switches (S1, S2, ..., Sn-1), each of said further switches provided between two points (P1, Q1), (P2, Q2), ... (Pn-1, Qn-1) of a winding of the magnet coil system, said disjoint partial regions (1, 2, ..., n-1) having associated inductances $L_1, L_2, \ldots, L_{n-1}$ and generating magnetic field contributions $B_1, B_2, \ldots, B_{n-1}$ to the homogeneous magnetic field $B_0$ in the measuring volume, wherein $$\alpha = \left|L_0 \sum_{j=1}^{n}(L^{-1})_{jn}\frac{B_j}{B_0}\right| \leq 0.8$$

with $1 \leq j \leq n$ and $B_n$ being a magnetic field contribution to the homogeneous magnetic field $B_0$ of a residual region (n) of the magnet coil system, reduced by said separately superconductingly short-circuited partial regions (1, 2, ..., n-1), and having an inductance $L_n$, wherein $(L^{-1})_{jn}$ is an entry of a jth line and nth column of an inverse of an inductance matrix of the magnet coil system, wherein $L_0$ is said overall magnetic inductance equal to a sum of all entries of said inductance matrix; and c) activating said one or more further superconducting switches (S1, S2, . . . , Sn-1) to separately superconductingly short-circuit said partial regions (1, 2, . . . , n-1) at a start of said persistent mode of the magnet coil system.

2. The method of claim 1, further comprising recharging said operating current $I_0$ at defined time intervals by opening said superconducting switch S0 with closed further superconducting switches (S1, S2, . . . Sn-1).

3. The method of claim 1, wherein during recharging of the superconducting magnet coil system, at least one of said further superconducting switches (S1, S2, . . . Sn-1) of said separately superconductingly short-circuited partial regions (1, 2, . . . , n-1) is already closed upon reaching a charging current $I_x$ which is smaller than a nominal value of said operating current $I_0$.

4. An NMR (nuclear magnetic resonance) magnet coil system having superconducting conductor structures with an overall magnetic inductance $L_0$ for generating a homogeneous magnetic field $B_0$ in a measuring volume, the system comprising:

means for short-circuiting the magnet coil system using at least one superconducting switch (S0) through which an operating current $I_0$ flows in a persistent mode;

means for defining one or more disjoint partial regions (1, 2, . . . , n-1) of the magnet coil system which can be separately superconductingly short-circuited using one or more further superconducting switches (S1, S2, . . . , Sn-1), each of said further switches provided between two points (P1, Q1), (P2, Q2), . . . (Pn-1, Qn-1) of a winding of the magnet coil system, said disjoint partial regions (1, 2, . . . , n-1) having inductances $L_1, L_2, \ldots, L_{n-1}$ and generating magnetic field contributions $B_1, B_2, \ldots, B_{n-1}$ to the homogeneous magnetic field $B_0$ in the measuring volume, wherein $$\alpha = \left| L_0 \sum_{j=1}^{n} (L^{-1})_{jn} \frac{B_j}{B_0} \right| \leq 0.8$$

with $1 \leq j \leq n$
and $B_n$ being a magnetic field contribution to the homogeneous magnetic field $B_0$ of a residual region (n) of the magnet coil system, reduced by said separately superconductingly short-circuited partial regions (1, 2, . . . , n-1), and having an inductance $L_n$, wherein $(L^{-1})_{jn}$ is an entry of a jth line and nth column of an inverse of an inductance matrix of the magnet coil system, wherein $L_0$ is said overall magnetic inductance equal to a sum of all entries of said inductance matrix; and means for activating said one or more further superconducting switches (S1, S2, . . . , Sn-1) to separately superconductingly short-circuit said partial regions (1, 2, . . . , n-1) at a start of said persistent mode of the magnet coil system.

5. The NMR magnet coil system of claim 4, wherein precisely one further superconducting switch (S1) is provided between two points P1 and Q1 of said winding of the magnet coil system which, during operation, separately superconductingly short-circuits a partial region (1) of the magnet coil system with an inductance $L_1$ and generating a magnetic field contribution $B_1$ to the homogeneous magnetic field $B_0$ in the measuring volume, wherein:

$$\alpha = \left| \frac{L_0}{L_1 L_2 - L_{12}^2} \left( \frac{B_2}{B_0} L_1 - \frac{B_1}{B_0} L_{12} \right) \right| \leq 0.8$$

with $B_2$ being a magnetic field contribution to the homogeneous magnetic field $B_0$ of said residual region (2) of the magnet coil system, reduced by said separately superconductingly short-circuited partial region (1), and having an inductance $L_2$ and a mutual inductance $L_{12}$ relative to said separately superconductingly short-circuited partial region (1).

6. The NMR magnet coil system of claim 4, wherein $\alpha \leq$ one of 0.5, 0.2, and 0.05.

7. The NMR magnet coil system of claim 4, wherein said separately superconductingly short-circuited partial regions (1, 2, . . . , n-1) and said residual region (n) of the magnet coil system are designed such that said residual region (n) produces a largely homogeneous magnetic field contribution $B_n$ to the homogeneous magnetic field $B_0$ in the measuring volume.

8. The NMR magnet coil system of claim 7, wherein said separately superconductingly short-circuited partial regions (1, 2, . . . , n-1) and said residual region (n) of the magnet coil system each comprise a homogenization means for homogenizing a magnetic field contribution $B_j$ produced by a respective said partial region and said residual region in the measuring volume, the homogenization means of various regions being disposed at mutual spatial separation from another.

9. The NMR magnet coil system of claim 8, wherein said homogenization means are disposed with spatial separation from field-generating windings of a respectively associated said partial region (1, 2, . . . , n-1) or said residual region (n) of the magnet coil system.

10. The NMR magnet coil system of claim 7, wherein a gradient of second order in said magnetic field contribution $B_j$ of a respective said partial region largely vanishes.

11. The NMR magnet coil system of claim 4, further comprising shim coils, wherein all said partial regions (1, 2, . . . , n-1) and said residual region (n) of the magnet coil system which provide said magnetic field contributions $B_j$ to the homogeneous magnetic field $B_0$ in the measuring volume are decoupled from said shim coils.

12. The NMR magnet coil system of claim 11, wherein said shim coils are $z^2$ shim coils.

13. The NMR magnet coil system of claim 4, further comprising at least one additional current path which is superconductingly short-circuited during operation and which is inductively coupled to at least one of said partial regions (1, 2, . . . , n-1) and said residual region (n) of the magnet coil system.

14. The NMR magnet coil system of claim 13, wherein said at least one additional current path produces a shim field in the measuring volume due to inductive charging which compensates for magnetic field inhomogeneities produced by at least one of said partial regions (1, 2, . . . , n-1) and said residual region (n) of the magnet coil system.

15. The NMR magnet coil system of claim 4, wherein the magnet coil system is built in sections and at least one of said separately superconductingly short-circuited partial regions (1, 2, . . . , n-1) coincides with at least one of said sections.

16. The NMR magnet coil system of claim 15, wherein said sections comprise external electrical connecting lines for individual sections, and further comprising additional electrical connecting lines having tap points at selected locations within said sections of the magnet coil system.

17. The NMR magnet coil system of claim 16, wherein said the tap points for said additional electric connecting lines are disposed in a substantially continuous manner in winding layers on said sections of the magnet coil system.

18. The NMR magnet coil system of claim 4, further comprising ferromagnetic elements which generate an additional magnetic field contribution $\Delta B_0$ to the magnetic field $B_0$ in the measuring volume, wherein an overall magnetic field $B=B_0+\Delta B_0$ in the measuring volume is homogeneous.

19. The NMR magnet coil system of claim 4, further comprising a superconducting current limiter (SB) connected in series with at least one of said further superconducting switches (S1, S2, . . . , Sn−1).

* * * * *